(12) United States Patent
Hirakawa et al.

(10) Patent No.: US 11,142,644 B2
(45) Date of Patent: Oct. 12, 2021

(54) THERMALLY CONDUCTIVE POLYORGANOSILOXANE COMPOSITION

(71) Applicant: MOMENTIVE PERFORMANCE MATERIALS JAPAN LLC, Tokyo (JP)

(72) Inventors: Daigo Hirakawa, Tokyo (JP); Masanori Takanashi, Tokyo (JP); Atsushi Sakamoto, Tokyo (JP)

(73) Assignee: MOMENTIVE PERFORMANCE MATERIALS JAPAN LLC, Tokyo (JP)

( * ) Notice: Subject to any disclaimer, the term of this patent is extended or adjusted under 35 U.S.C. 154(b) by 221 days.

(21) Appl. No.: 16/481,086

(22) PCT Filed: Jan. 25, 2018

(86) PCT No.: PCT/JP2018/002191
§ 371 (c)(1),
(2) Date: Jul. 26, 2019

(87) PCT Pub. No.: WO2018/139506
PCT Pub. Date: Aug. 2, 2018

(65) Prior Publication Data
US 2021/0130615 A1    May 6, 2021

(30) Foreign Application Priority Data

Jan. 27, 2017   (JP) .............................. JP2017-013108
Jan. 18, 2018   (JP) .............................. JP2018-006199

(51) Int. Cl.
| | | |
|---|---|---|
| *C08G 77/12* | (2006.01) | |
| *C08L 83/04* | (2006.01) | |
| *C08G 77/04* | (2006.01) | |
| *C08G 77/08* | (2006.01) | |
| *C08G 77/18* | (2006.01) | |
| *C08G 77/20* | (2006.01) | |
| *C08G 77/00* | (2006.01) | |
| *C08K 3/22* | (2006.01) | |
| *C08K 3/36* | (2006.01) | |
| *C08K 9/06* | (2006.01) | |

(52) U.S. Cl.
CPC ............ *C08L 83/04* (2013.01); *C08G 77/045* (2013.01); *C08G 77/08* (2013.01); *C08G 77/12* (2013.01); *C08G 77/18* (2013.01); *C08G 77/20* (2013.01); *C08G 77/70* (2013.01); *C08K 3/22* (2013.01); *C08K 3/36* (2013.01); *C08K 9/06* (2013.01); *C08K 2003/2227* (2013.01); *C08K 2201/003* (2013.01); *C08L 2203/20* (2013.01); *C08L 2205/025* (2013.01); *C08L 2205/035* (2013.01)

(58) Field of Classification Search
CPC ........ C08G 77/12; C08G 77/20; C08G 77/18; C08L 83/04; C07F 7/084; B01J 23/40; C08K 2201/001
See application file for complete search history.

(56) References Cited

U.S. PATENT DOCUMENTS

| | | | |
|---|---|---|---|
| 2003/0049466 A1 | 3/2003 | Yamada et al. | |
| 2007/0185259 A1* | 8/2007 | Hoshino | ................. C08L 83/04 524/588 |
| 2009/0082517 A1 | 3/2009 | Tanaka et al. | |
| 2015/0138740 A1* | 5/2015 | Shin | ......................... C08J 3/243 361/760 |

FOREIGN PATENT DOCUMENTS

| | | | |
|---|---|---|---|
| JP | 2002003831 A | | 1/2002 |
| JP | 2002327116 A | | 11/2002 |
| JP | 2009091561 A | | 4/2009 |
| JP | 2009203373 A | | 9/2009 |
| JP | 2009292928 A | | 12/2009 |
| JP | 2015074751 A | | 4/2015 |
| JP | 2015091948 | * | 5/2015 |
| JP | 2015214703 A | | 12/2015 |
| WO | 2005030874 A1 | | 4/2005 |

OTHER PUBLICATIONS

JP 2015 091948 machine translation (2015).*
Extended European Search Report (EESR) dated Oct. 9, 2020 issued European Application No. 18745422.8.
International Search Report (ISR) (and English language translation thereof) dated Mar. 13, 2018 issued in International Application No. PCT/JP2018/002191.
Written Opinion dated Mar. 13, 2018 issued in International Application No. PCT/JP2018/002191.

* cited by examiner

*Primary Examiner* — Kuo Liang Peng
(74) *Attorney, Agent, or Firm* — Holtz, Holtz & Volek PC

(57) ABSTRACT

The present invention relates to a thermally conductive polysiloxane composition that provides a cured product having excellent tackiness and flexibility in which the composition contains (A) a thermally conductive filler, (B) a siloxane compound having an alkoxysilyl group and a linear siloxane structure, (C) a polyorganosiloxane having at least two alkenyl groups bonded to silicon atoms per molecule, (D1) a linear polyorganohydrogensiloxane represented by the general formula (4), (D2) a polyorganohydrogensiloxane having per molecule at least three units represented by the general formula (5), and (E) a platinum catalyst.

3 Claims, No Drawings

THERMALLY CONDUCTIVE POLYORGANOSILOXANE COMPOSITION

TECHNICAL FIELD

The present invention relates to a thermally conductive polyorganosiloxane composition.

BACKGROUND ART

Electronic parts, such as a power transistor, an IC, and a CPU, use thermally conductive greases and thermally conductive sheets that use silicone and that have high thermal conductivity to prevent the accumulation of heat caused due to electrical heating elements. It has been known that thermally conductive fillers, such as silica powder, alumina, boron nitride, aluminum nitride, and magnesium oxide, and the silicone are used in combination to enhance thermal conductivity of the silicone (Patent Document 1), and that surface treatment is performed on a thermally conductive filler to fill the thermally conductive filler at a higher filling ratio (Patent Document 2).

Meanwhile, there are demands for a thermally conductive composition having flexibility. For such demands, an addition reaction curable thermally conductive polysiloxane composition containing an organopolysiloxane having at least two alkenyl groups per molecule, and an organohydrogenepolysiloxane having at least two hydrogen atoms bonded to silicon atoms per molecule that uses a combination of an organohydrogenesiloxane having a Si—H group in a side chain and an organohydrogenesiloxane having a Si—H group at a terminal has been known (Patent Document 3).

PRIOR ART DOCUMENTS

Patent Documents

Patent Document 1: Japanese Patent Application Kokai Publication No. 2002-003831
Patent Document 2: WO 2005/030874
Patent Document 3: Japanese Patent Application Kokai Publication No. 2002-327116

SUMMARY OF THE INVENTION

Problems to be Solved by the Invention

However, when an organohydrogenesiloxane having a Si—H group in a side chain and an organohydrogenesiloxane having a Si—H group at a terminal described in Patent Document 3 are used, flexibility and tackiness are not satisfactory.

An object of the present invention is to provide a thermally conductive polysiloxane composition that provides a cured product having excellent tackiness and flexibility.

Means for Solving the Problems

The present invention relates to the following.
[1] A thermally conductive polysiloxane composition containing:
(A) a thermally conductive filler;
(B) a siloxane compound having an alkoxysilyl group and a linear siloxane structure;
(C) a polyorganosiloxane having at least two alkenyl groups bonded to silicon atoms per molecule;
(D1) a linear polyorganohydrogensiloxane represented by the following general formula (4):

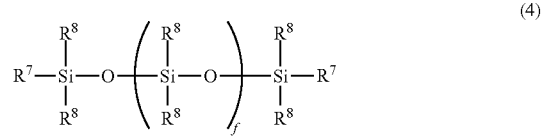

wherein,
$R^7$ is a hydrogen atom,
$R^8$ is each independently a monovalent hydrocarbon group having no aliphatic unsaturated bond and having 1 to 12 carbon atoms, and
f is 1 to 200;
(D2) a polyorganohydrogensiloxane having per molecule at least three units represented by the following general formula (5):

wherein,
$R^9$ is each independently a monovalent hydrocarbon group having no aliphatic unsaturated bond and having 1 to 12 carbon atoms,
$R^{10}$ is a hydrogen atom,
g is an integer of 0 to 2,
h is an integer of 1 or 2, and
g+h is an integer of 1 to 3, with the proviso that a case in which g is 1 and h is 1 is excluded; and
(E) a platinum catalyst.
[2] The thermally conductive polysiloxane composition described in [1], wherein a ratio of the sum of the number $H_{D1}$ of the hydrogen atoms bonded to the silicon atoms of (D1) and the number $H_{D2}$ of the hydrogen atoms bonded to the silicon atoms of (D2) ($H_{D1}+H_{D2}$) to the number $Vi_C$ of the alkenyl group of (C) (($H_{D1}+H_{D2}$)/$Vi_C$) is less than 1.50.
[3] The thermally conductive polysiloxane composition described in [1] or [2], wherein (D2) is a polyorganohydrogensiloxane comprising a $R^{11}_2HSiO_{1/2}$ unit (wherein $R^{11}$ is synonymous with $R^9$) and a $SiO_{4/2}$ unit, and having at least three hydrogen atoms bonded to silicon atoms per molecule.
[4] The thermally conductive polysiloxane composition described in any one of [1] to [3], wherein a ratio of the number $H_{D1}$ of the hydrogen atoms bonded to the silicon atoms of (D1) to the number $H_{D2}$ of the hydrogen atoms bonded to the silicon atoms of (D2) ($H_{D1}:H_{D2}$) is from 9.9:0.1 to 1:9.
[5] The thermally conductive polysiloxane composition described in any one of [1] to [4], wherein (B) is a siloxane compound represented by the following general formula (1):

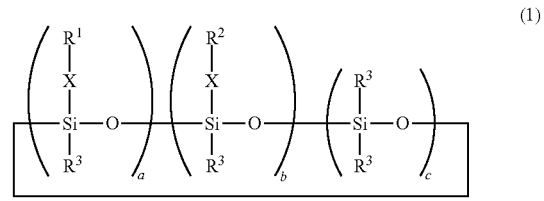

wherein, $R^1$ is a group having an alkoxysilyl group having 1 to 4 carbon atoms, $R^2$ is a monovalent hydrocarbon group having 6 to 18 carbon atoms or a linear organosiloxy group represented by the following general formula (2):

$$\left( \begin{array}{c} R^4 \\ | \\ -Si-O- \\ | \\ R^4 \end{array} \right)_d \begin{array}{c} R^4 \\ | \\ -Si-Y \\ | \\ R^4 \end{array} \quad (2)$$

wherein, $R^4$ is each independently a monovalent hydrocarbon group having 1 to 12 carbon atoms, Y is a group selected from the group consisting of a methyl group, a vinyl group, and $R^1$, and d is an integer of 2 to 500;

X is each independently a divalent hydrocarbon group having 2 to 10 carbon atoms, a and b are each independently an integer of 1 or more, c is an integer of 0 or more, a+b+c is an integer of 4 or more, and $R^3$ is each independently a monovalent hydrocarbon group having 1 to 6 carbon atoms or a hydrogen atom.

[6] The thermally conductive polysiloxane composition described in any one of [1] to [5], wherein (C) is a linear polyorganosiloxane represented by the following general formula (3):

$$R^5-\begin{array}{c} R^6 \\ | \\ Si \\ | \\ R^6 \end{array}-O-\left( \begin{array}{c} R^6 \\ | \\ Si \\ | \\ R^6 \end{array}-O- \right)_e \begin{array}{c} R^6 \\ | \\ Si \\ | \\ R^6 \end{array}-R^5 \quad (3)$$

wherein, $R^5$ is each independently an alkenyl group having 2 to 6 carbon atoms, $R^6$ is each independently a monovalent hydrocarbon group having 1 to 12 carbon atoms, and e is a number such that the viscosity of 0.01 to 50 Pa·s at 23° C.

Effect of the Invention

In the present invention, there can be provided a thermally conductive polysiloxane composition that provides a cured product having excellent tackiness and flexibility.

Mode for Carrying Out the Invention

[Definition of Terminology]

Structural units of siloxane compounds may be also written using abbreviations shown below (hereinafter, each of these structural units may be also referred to as "M unit", "D unit", and the like).

M: $-Si(CH_3)_3O_{1/2}$
$M^H$: $-SiH(CH_3)_2O_{1/2}$
$M^{vi}$: $-Si(CH=CH_2)(CH_3)_2O_{1/2}$
D: $Si(CH_3)_2O_{2/2}$
$D^H$: $SiH(CH_3)O_{2/2}$
T: $Si(CH_3)O_{3/2}$
Q: $SiO_{4/2}$ (tetrafunctional)

In the present specification, specific examples of the groups are as follows.

Examples of the monovalent hydrocarbon group include alkyl groups, cycloalkyl groups, aryl groups, and alkenyl groups. Examples of the monovalent hydrocarbon group having no aliphatic unsaturated bond include the monovalent hydrocarbon group described above except the alkenyl group.

Examples of the alkenyl group include a vinyl group, an allyl group, a 3-butenyl group, 5-hexenyl group, and the like.

Examples of the alkyl group include a methyl group, an ethyl group, a propyl group, a butyl group, a pentyl group, a hexyl group, an octyl group, a decyl group, a dodecyl group, a hexadecyl group, and an octadecyl group, and the like.

Examples of the cycloalkyl group include a cyclopentyl group, a cyclohexyl group, and the like.

Examples of the aryl group include a phenyl group, a naphthyl group, a tolyl group, a xylyl group, and the like.

The alkenyl group, the alkyl group, the cycloalkyl group, and the aryl group may be substituted by halogen, such as chlorine, fluorine, and bromine.

In the present specification, "(A) thermally conductive filler" may be also referred to as "(A)". The same applies to "(E) platinum catalyst" and the like.

[Thermally Conductive Polysiloxane Composition]

The thermally conductive polysiloxane composition (hereinafter, also simply referred to as "composition") contains: (A) a thermally conductive filler; (B) a siloxane compound having an alkoxysilyl group and a linear siloxane structure; (C) a polyorganosiloxane having at least two alkenyl groups bonded to silicon atoms per molecule; (D1) a linear polyorganohydrogensiloxane represented by the general formula (4); (D2) a polyorganohydrogensiloxane having per molecule at least three units represented by the general formula (5); and (E) a platinum catalyst.

A cured product of the composition has excellent tackiness, and thus it is possible to achieve both significant suppression of peeling of the cured product of the composition from a substrate and ease of reapplying a cured product of the composition at the time of repair.

[(A) Thermally Conductive Filler]

Examples of thermally conductive fillers include generally known inorganic fillers, such as alumina, magnesium oxide, zinc oxide, boron nitride, aluminum nitride, a silica powder, silicon carbide, a metal powder, diamond, aluminum hydroxide, and carbon. Especially preferred are alumina, zinc oxide, aluminum nitride, and silicon carbide. With respect to the inorganic filler, there is no particular limitation as long as it is of a grade that can be used as a thermally conductive filler, and those which are commercially available can be used. Furthermore, as the inorganic filler, a plurality of types of different chemical species can be used in combination.

With respect to the average particle diameter of the thermally conductive filler, there is no particular limitation as long as the thermally conductive filler is of a grade that can be used as a thermally conductive filler, but a thermally conductive filler having an average particle diameter of 300 μm or less is preferably used. With respect to the thermally conductive filler having an average particle diameter in the above range, when the thermally conductive filler having a larger average particle diameter is incorporated, the filling ratio cannot be increased. On the other hand, when the thermally conductive filler having a smaller average particle diameter is incorporated, the resultant composition tends to have an increased viscosity. By incorporating the thermally conductive filler having an appropriately selected average particle diameter, a composition having a viscosity suitable for the purpose can be obtained.

With respect to the thermally conductive filler, it is preferred that a filler having a relatively large particle diameter and a filler having a relatively small particle diameter are used in combination. By using a plurality of types of fillers having different particle diameters in combination, the filler having a relatively small particle diameter goes into voids caused in the filler having a relatively large particle diameter, enabling higher filling. When a plurality of types of fillers having different particle diameters are used, the proportion of the fillers incorporated can be arbitrary.

With respect to the shape of the inorganic particles used as the thermally conductive filler, there is no particular limitation. For example, any of particles of a spherical shape, particles of a rounded shape, and particles of an indefinite shape can be used, and further two or more types of these particles can be used in combination. In the case where the inorganic particles have a rounded shape or an indefinite shape, the average particle diameter of the inorganic particles is defined by a method known to those skilled in the art. The average particle diameter can be determined as, for example, a weight average value (or a median diameter) using a particle size distribution measurement apparatus by, for example, a laser light diffraction method.

[(b) Siloxane Compound having Alkoxysilyl Group and Linear Siloxane Structure]

The composition contains a siloxane compound having an alkoxysilyl group and a linear siloxane structure as a surface treating agent of (A). The molecular structure of (B) is not particularly limited and is a linear structure, branched structure, or cyclic structure, but a cyclic structure is preferred. Examples of such preferred (B) include siloxane compounds represented by the following general formula (1):

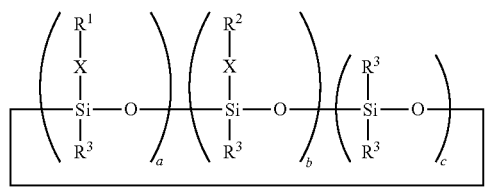

(1)

wherein $R^1$, $R^2$, $R^3$, X, a, b, and c are as defined above. In the siloxane compounds represented by the general formula (1), the unit containing $R^1$, the unit containing $R^2$, and the unit represented by $SiR^3{}_2O$ are not necessarily arranged as shown in the general formula (1) above. For example, the unit represented by $SiR^3{}_2O$ may be present between the unit containing $R^1$ and the unit containing $R^2$.

The siloxane compound represented by the general formula (1) can introduce a large number of hydrolyzable groups into its cyclic structure, and further has the hydrolyzable groups concentrated in the position of the structure. Therefore, it is considered to have an increased treatment efficiency for a thermally conductive filler, enabling higher filling. In addition, the siloxane compound represented by the general formula (1) per se has high heat resistance, and therefore can cause the thermally conductive polysiloxane composition to have high heat resistance.

In the general formula (1), $R^1$ is a hydrolyzable functional group containing an alkoxysilyl group having 1 to 4 carbon atoms, and, as more specific examples, there can be mentioned groups having the structures shown below. $R^1$ may be directly bonded to X with silicon, but may be bonded to X through a linking group, such as an ester linkage. More specific examples of $R^1$'s include groups having the structures shown below.

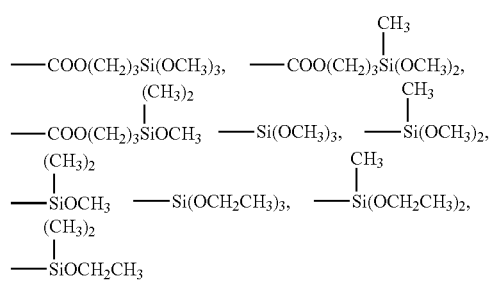

Especially, in view of a tendency toward a further improvement of the treatment efficiency for the thermally conductive filler, $R^1$ is preferably a group of a structure having two or more alkoxysilyl groups, especially having three alkoxysilyl groups. Further, in view of easy availability of the raw material, $R^1$ preferably contains a methoxysilyl group.

$R^2$ is a monovalent hydrocarbon group having 6 to 18 carbon atoms or a linear organosiloxy group represented by the following general formula (2):

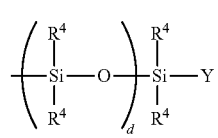

(2)

wherein $R^4$, Y, and d are as defined above.

When $R^2$ is a monovalent hydrocarbon group having 6 to 18 carbon atoms, an alkyl group having 6 to 18 carbon atoms is preferred, and an alkyl group having 6 to 14 carbon atoms is particularly preferred. In $R^2$, the longest carbon chain moiety in the alkyl group preferably has 6 or more carbon atoms, and in this case, $R^2$ may have a branched structure as long as the total number of the carbon atoms is in the range described above. When the number of carbon atoms is set to this range, a higher effect for flowability is achieved, and a high proportion can be blended. Furthermore, excellent handleability is achieved, and uniform dispersion can be performed easier.

When $R^2$ is a linear organosiloxy group represented by the general formula (2), d is an integer of 2 to 500, preferably an integer of 4 to 400, more preferably an integer of 10 to 200, even more preferably an integer of 10 to 100, and particularly preferably an integer of 10 to 50. When d is in this range, the effect on the fluidity is improved, enabling high incorporation, so that the viscosity of the siloxane compound represented by the general formula (1) can be reduced. Each $R^4$ is independently a monovalent hydrocarbon group having 1 to 12 carbon atoms, and is preferably an alkyl group having 1 to 12 carbon atoms or an aryl group having 6 to 12 carbon atoms. In view of easy synthesis of the compound, $R^4$ is particularly preferably a methyl group. Y is a group selected from the group consisting of a methyl group, a vinyl group, and $R^1$. In view of easy synthesis of the compound, Y is preferably a methyl group or a vinyl group. $R^2$ is preferably a linear organosiloxy group represented by the general formula (2) because the affinity between the thermally conductive filler and the base polymer tends to be increased through $R^2$, and a substance with excellent handleability, such that the viscosity of the composition has been reduced, tends to be obtained.

X is a linking group that bonds $R^1$ and $R^2$ with the cyclic siloxane moiety of the siloxane represented by the general formula (1). X is a divalent hydrocarbon group having 2 to 10 carbon atoms, and is preferably an alkylene group having 2 to 10 carbon atoms, such as —$CH_2CH_2$—, —$CH_2CH_2CH_2$—, —$CH_2CH_2CH_2CH_2CH_2CH_2$—, —$CH_2CH(CH_3)$—, and —$CH_2CH(CH_3)CH_2$—. In view of easy synthesis of the compound, X is preferably —$CH_2CH_2$— or —$CH_2CH(CH_3)$—.

$R^3$ is each independently a monovalent hydrocarbon group having 1 to 6 carbon atoms. As the monovalent hydrocarbon group having from 1 to 6 carbon atoms, an alkyl group having from 1 to 6 carbon atoms is preferred. In view of easy synthesis of the compound, $R^3$ is preferably a methyl group or a hydrogen atom.

a is an integer of 1 or more, and preferably 1. b is an integer of 1 or more, and preferably 1 or 2. c is an integer of 0 or more, and preferably 0 to 2. Further, the sum of a+b+c is an integer of 4 or more, and is preferably 4 from the viewpoint of easy synthesis of the compound.

Therefore, the siloxane compound represented by the general formula (1) is preferably compounds represented by the following structural formulae.

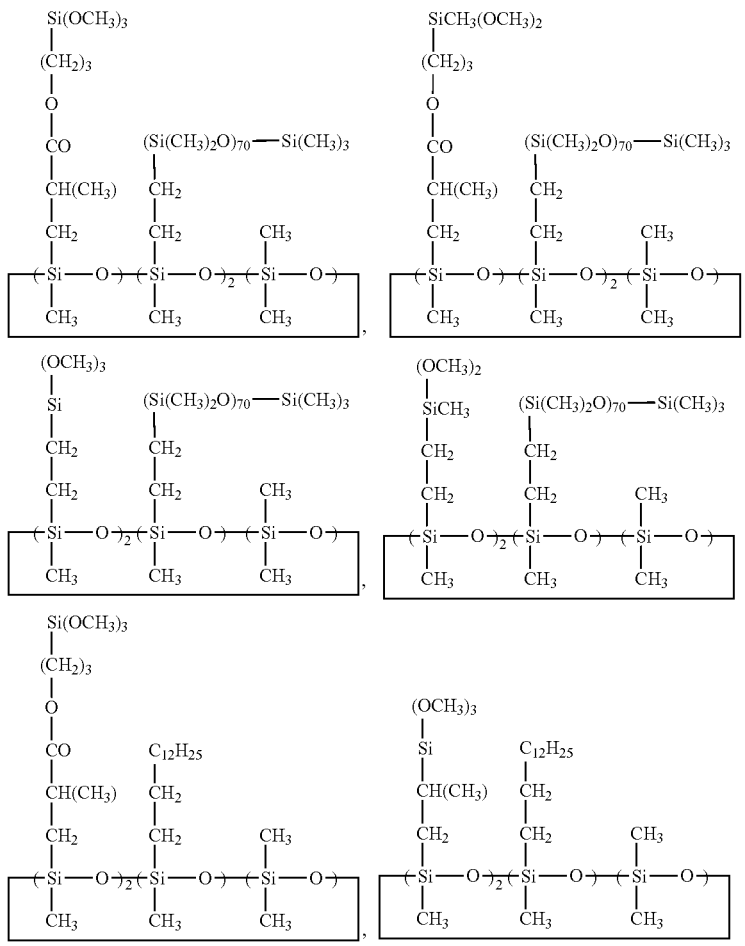

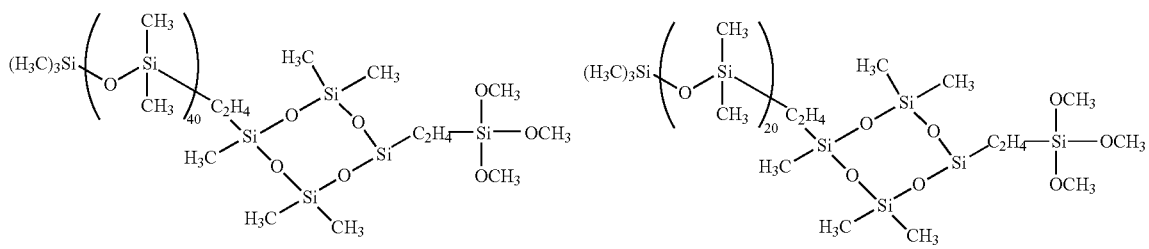

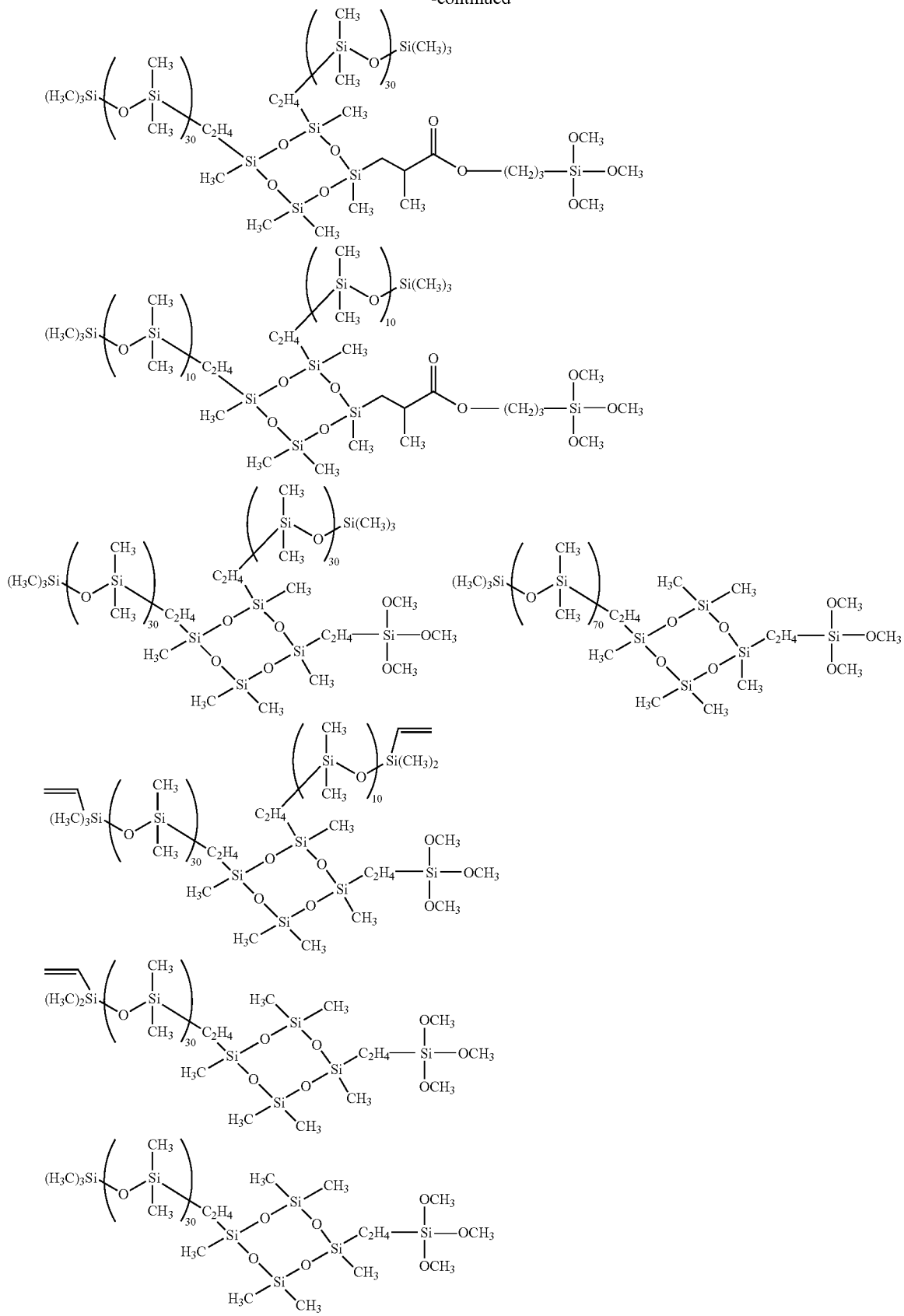

[(C) Polyorganosiloxane Having at Least Two Alkenyl Groups Bonded to Silicon Atoms Per Molecule]

The polyorganosiloxane having at least two alkenyl groups bonded to silicon atoms per molecule (C) is a base polymer. When the number of the alkenyl groups bonded to the silicon atoms is less than 2, it becomes difficult to sufficiently cure the resulting composition. Note that (C) contains no hydrogen atom bonded to silicon atom and no alkoxysilyl group. That is, (C) is not (B) and (D2).

Examples of the alkenyl group include alkenyl groups having 2 to 6 carbon atoms, and in view of easy preparation of the compound, a vinyl group is preferred. The alkenyl group may be bonded at a terminal or in a middle of a molecular chain but is preferably bonded to both terminals of the molecular chain from the viewpoint of obtaining a cured product having superior flexibility. Examples of the group bonded to a silicon atom except the alkenyl group include monovalent hydrocarbon group having no aliphatic unsaturated bond and having from 1 to 12 carbon atoms. With respect to the hydrocarbon group having no aliphatic unsaturated bond and having 1 to 12 carbon atoms, alkyl groups having 1 to 12 carbon atoms, aryl groups having 6 to 12 carbon atoms, and cycloalkyl groups having 3 to 12 carbon atoms are preferred, and a methyl group or a phenyl group is particularly preferred. (C) is linear or branched, and preferably linear.

Therefore, (C) is more preferably linear polyorganosiloxane represented by the following general formula (3):

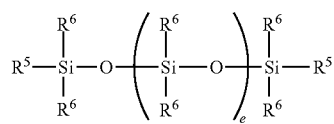

(3)

wherein $R^5$, $R^6$, and e are as defined above.

In the general formula (3), $R^6$ is synonymous with $R^4$. From the viewpoint of easy availability or easy preparation of the compound, $R^5$ is preferably a vinyl group, and $R^6$ is preferably a methyl group. Therefore, (C) is particularly preferably polymethylvinylsiloxane, in which both terminals are capped by dimethylvinylsiloxane units and units in the middle comprises dimethylsiloxane units.

From the viewpoints of achieving excellent workability as a composition (viscosity and extrudability) and obtaining a cured product having superior flexibility, the viscosity of (C) at 23° C. is 0.01 to 50 Pa·s, preferably 0.02 to 20 Pa·s, and particularly preferably 0.05 to 10 Pa·s. The weight average molecular weight of (C) is preferably adjusted to set the viscosity to be within the viscosity range. The viscosity is a value measured at 23° C. by using a B-type rotational viscometer. Examples of the rotor number include No. 1 to No. 4, and examples of the rotational speed include 12, 30, and 60 rpm. The type of the rotor and the rotational speed can be appropriately selected depending on the viscosity of the measurement target.

[(D1) Linear Polyorganohydrogensiloxane]

(D1) Linear polyorganohydrogensiloxane is represented by the following general formula (4):

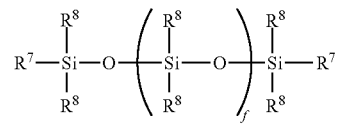

(4)

wherein $R^7$, $R^8$, and f are as defined above. The hydrogen atoms bonded to silicon atoms contained in (D1) and (D2) contribute as crosslinking agents to perform a hydrosilylation reaction with an alkenyl group in (C).

In the general formula (4), the number of f is in the range of 1 to 200, preferably in the range of 5 to 100, and more preferably in the range of 10 to 50. When f is in this range, a higher effect for flowability is achieved, a high incorporation can be blended, the viscosity of the siloxane compound can be suppressed, the shape stability is enhanced, and a cured product having superior flexibility can be obtained. $R^8$ is a monovalent hydrocarbon group having no aliphatic unsaturated bond and having 1 to 12 carbon atoms, and is preferably an alkyl group having 1 to 12 carbon atoms or an aryl group having 6 to 12 carbon atoms. From the viewpoint of easy synthesis of the compound, $R^8$ is particularly preferably a methyl group.

[(D2) Polyorganohydrogensiloxane Having Per Molecule at Least Three Units Represented by the General Formula (5)]

(D2) has per molecule at least three units represented by the following general formula (5):

(5)

wherein $R^9$, $R^{10}$, g, and h are as defined above. Note that (D2) has no alkoxysilyl group and no alkenyl group bonded to a silicon atom. That is, (D2) is not (B) and (C).

The molecular structure of (D2) is not particularly limited and is a linear, cyclic, or branched structure. In the general formula (5), g is an integer of 0 to 2, and preferably 1 or 2. h is an integer of 1 or 2, and preferably 1. Furthermore, the sum of g+h is an integer of 1 to 3, and preferably 3 from the viewpoint of easy synthesis of the compound. $R^9$ is synonymous with $R^8$. From the viewpoint of easy availability or easy preparation of the compound, $R^9$ is preferably a methyl group. In the siloxane unit except the unit represented by the general formula (5) in (D2), the organic group bonded to a silicon atom is each independently synonymous with $R^9$, and from the viewpoint of easy synthesis of the compound, a methyl group is preferred. From the viewpoint of easy availability or easy preparation, (D2) is preferably a polyorganohydrogensiloxane comprising a $R^{11}{}_2HSiO_{1/2}$ unit (wherein, $R^{11}$ is as defined above) and an $SiO_{4/2}$ unit, and having at least three hydrogen atoms bonded to silicon atoms per molecule. The content of the hydrogen atoms bonded to the silicon atoms of (D2) is not particularly limited but is preferably from 0.1 to 1.2 wt. %, and particularly preferably from 0.5 to 1.1 wt. %. When the content of the hydrogen atoms bonded to silicon atoms of (D2) is 0.1 wt. % or more, higher thermal conductivity can be achieved even with a smaller content of (D2). When the content of the hydrogen atoms bonded to silicon atoms of (D2) is 1.2 wt. % or less, the crosslinking density does not become excessively high, and thus a cured product having superior flexibility can be obtained. The molecular weight of (D2) is not particularly limited but is preferably 330 to 50,000, and particularly preferably 500 to 10,000. When the molecular weight of (D2) is 330 or more, the crosslinking density does not become excessively high, and thus a cured product having superior flexibility can be obtained. When the molecular weight of (D2) is 50,000 or less, excellent workability of the composition can be achieved. In the present specification, the molecular weight is a number average molecular weight measured by gel permeation chromatography based on calibration with polystyrene. To achieve the content of the hydrogen atoms bonded to silicon atoms and the molecular weight of (D2) described above in preferable (D2), the proportions of the $R^{11}{}_2HSiO_{1/2}$ unit and the $SiO_{4/2}$ unit can be appropriately adjusted.

[(E) Platinum Catalyst]

The platinum catalyst (E) is a curing catalyst used for reacting an unsaturated group of (C) with a hydrogen group of (D) to obtain a cured product. Examples of the platinum compounds include chloroplatinic acid, a platinum-olefin complex, a platinum-vinylsiloxane complex, a platinum-phosphorus complex, a platinum-alcohol complex, and platinum black. For obtaining a longer pot life, the activity of the catalyst can be suppressed by adding (F) a reaction inhibitor. Examples of known reaction inhibitors for the platinum catalyst include acetylenic alcohols, such as 2-methyl-3-butyn-2-ol and 1-ethynyl-2-cyclohexanol, and diallyl maleate.

[Composition]

The content of each component in the composition is as follows.

The content of (A) is preferably 10 to 5,000 parts by mass, more preferably 50 to 4,000 parts by mass, and particularly preferably 100 to 3,000 parts by mass, per 100 parts by mass of the total content of (B), (C), (D1), and (D2). When the content of (A) is set to such a range, higher thermal conductivity can be achieved.

The content of (B) is preferably 0.01 to 20 parts by mass, and particularly preferably 0.1 to 15 parts by mass, per 100 parts by mass of the content of (A). When the amount of (B) is set to this range, higher thermal conductivity can be achieved while the property of filling of the thermally conductive filler is enhanced.

Furthermore, the content of (B) is preferably 0.01 parts by mass or more, and particularly preferably 0.1 to 500 parts by mass, per 100 parts by mass of the total content of (C), (D1), and (D2). When the amount of (B) is 0.01 parts by mass or more per 100 parts by mass of the total content of (C), (D1), and (D2), a surface treatment effect of the thermally conductive filler is sufficiently exhibited, and a greater amount of (A) can be blended. When the amount of (B) is 500 parts by mass or less per 100 parts by mass of the total content of (C), (D1), and (D2), excellent mechanical properties and/or heat resistance after the curing can be achieved.

The content of (C) can be appropriately set depending on the thermal conductivity required for the composition but is preferably 1 to 30 parts by mass, and more preferably 3 to 20 parts by mass, per 100 parts by mass of the content of (A).

The content of (E) is preferably an amount that allows the amount of platinum element to be 0.1 to 1,000 ppm relative to the amount of the alkenyl group-containing polyorganosiloxane of (C). When the content is within such a range, curability and curing rate are sufficient.

The contents of (C), (D1), and (D2) can be appropriately set depending on the thermal conductivity required for the composition; however, the amounts are preferably such that the ratio of the sum of the number $H_{D1}$ of the hydrogen atoms bonded to silicon atoms of (D1) and the number $H_{D2}$ of the hydrogen atoms bonded to silicon atoms of (D2) $(H_{D1}+H_{D2})$ to the number $Vi_C$ of the alkenyl group of (C) $((H_{D1}+H_{D2})/Vi_C)$ is less than 1.50. When the ratio $(H_{D1}+H_{D2})/Vi_C$ is less than 1.50, elongation of the cured product is further enhanced, and superior tackiness can be achieved. The ratio $(H_{D1}+H_{D2})/Vi_C$ is preferably 1.20 or less, more preferably 1.10 or less, even more preferably 0.90 or less, and particularly preferably 0.80 or less. The ratio $(H_{D1}+H_{D2})/Vi_C$ is not particularly limited but is preferably 0.60 or more, more preferably 0.70 or more, and particularly preferably 0.80 or more.

The ratio of the number $H_{D1}$ of the hydrogen atoms bonded to silicon atoms of (D1) to the number $H_{D2}$ of the hydrogen atoms bonded to silicon atoms of (D2) $(H_{D1}:H_{D2})$ is not particularly limited but is preferably 9.9:0.1 to 1:9, and more preferably 9:1 to 5:5. When the ratio is within such a range, elongation of the cured product of the composition is further enhanced, and superior tackiness can be achieved.

It is particularly preferable that the ratio $(H_{D1}+H_{D2})/Vi_C$ is 0.85 or less and $H_{D1}:H_{D2}$ is from 9:1 to 8:2. When the ratios are within such ranges, particularly high elongation of the cured product of the composition and particularly superior tackiness can be achieved.

With respect to a method of preparing the composition, the composition may be prepared by mixing (B), (C), (D1) and (D2), and (A) by using a kneader. Otherwise, the composition may be prepared by mixing (B) and (A) to perform the surface treatment, and then by dispersing the resultant mixture in (C), (D1), and (D2). Furthermore, as necessary, heating, pressure reduction, or other treatment by known methods may be performed. Furthermore, a mixture to which (C) has been blended in advance may be prepared, and then a mixture of (D1), (D2), and (E) may be added immediately before curing. (F) is preferably added at the same stage as (E). In the composition, if necessary, a pigment, a flame retardant, an adhesion imparting agent, a heat resistance imparting agent, a diluent, or an organic solvent and others, which have been known to those skilled in the art, can be appropriately incorporated in such an amount that the effects of the present invention are not sacrificed. Because the cured product of the composition has high elongation, the cured product exhibits excellent followability with regard to deformation (e.g., bending) of a base material when an adhesion imparting agent is added as an optional component.

The composition can be cured at room temperature or by being heated. The conditions for heat curing are known to those skilled in the art, and, as examples of apparatuses which can be used in a curing reaction caused due to heat, there can be mentioned apparatuses known to those skilled in the art, such as a constant temperature bath. The heating conditions can be appropriately selected according to the heat resistance temperature of a member to which the composition is applied, and the curing time can be determined. For example, heat at a temperature higher than room temperature (23° C.) but 120° C. or lower can be applied to the composition for a period of time in the range of 1 minute to 5 hours. From the viewpoint of operability, the heating temperature is preferably 40 to 120° C., more preferably 50 to 110° C., and particularly preferably 60 to 100° C. From the viewpoint of simplicity of the curing process, the heating time is preferably 5 minutes to 72 hours, more preferably 5 minutes to 3 hours, and particularly preferably 10 minutes to 2 hours. Furthermore, when curing is performed at room temperature, the curing time is preferably 72 hours or less, and particularly preferably 24 hours or less.

A silicone rubber obtained by curing the composition can be used as a radiator member for electronic devices and electronic parts, such as an integrated circuit element.

EXAMPLES

Hereinbelow, the present invention will be described with reference to the following Examples, which should not be construed as limiting the scope of the present invention. In the following Examples and Comparative Examples, the "part(s)" indicates part(s) by mass.

Examples 1 to 15 and Comparative Examples 1 to 3

The materials used in the examples and the comparative examples are as shown below.
<(A) Thermally Conductive Filler>
AS-40: Alumina having the rounded shape and having the average particle diameter of 12 μm (manufactured by Showa Denko K.K.)
AL43KT: Alumina having the polygonal shape and having the average particle diameter of 4.6 μm (manufactured by Showa Denko K.K.)
AL160SG-4: Easily sinterable alumina having the average particle diameter of 0.55 μm (manufactured by Showa Denko K.K.)
Silazane-treated silica: Silica obtained by treating aerosol silica having the average particle diameter of 200 μm (AEROSIL 200, manufacturer by Nippon Aerosil Co., Ltd.) with hexamethyldisilazane
<(B) Siloxane Compound Having an Alkoxysilyl Group and a Linear Siloxane Structure>
(B1) Cyclic siloxane compound having a polysiloxane chain having a polymerization degree of 70 (compound 1):

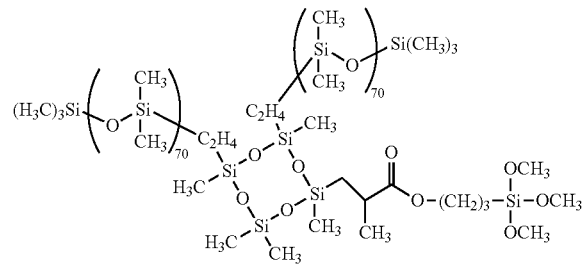

In a 5,000 mL flask, 1,100 g of 3-(methacryloyloxy) propyltrimethoxysilane was added to a solution of 440 g of toluene and 1,992 g of a cyclic siloxane having three Si—H bonds in the presence of a platinum catalyst. The resultant mixture was subjected to reaction at 120° C. for 3 hours. The solvent was removed from the resultant reaction mixture, followed by distillation, to obtain a colorless liquid.
1,650 g of a linear vinylpolysiloxane (polysiloxane represented by $MD_{70}M^{Vi}$; manufactured by Momentive Performance Materials Inc.) was added to 77 g of the above-obtained liquid. A platinum catalyst was further added and the resultant mixture was subjected to reaction at 120° C. for 5 hours, obtaining an intended siloxane having the viscosity of 0.20 Pa·s in the form of a colorless oily material.
In the FT IR measurement, disappearance of an absorption peak around 2,150 cm$^{-1}$ originated from a Si—H group and presence of an absorption peak around 2,850 cm$^{-1}$ originated from a methoxy group were confirmed. In the $^1$H NMR measurement (at 500 MHz, in CDCl$_3$), a signal originated from a methoxy group is observed around 3.56 ppm. The area ratio of the signal originated from a methoxy group and the signal appearing around 0.04 ppm originated from a methyl group adjacent to silicon has confirmed that two linear polysiloxane structures in which the number of D units is about 70 are introduced per molecule. From the results of the GPC measurement, a monomodal peak (degree of dispersion: 1.15) was confirmed, and the measured average molecular weight was consistent with the structural formula.
(B2) Cyclic siloxane compound having a polysiloxane chain having a polymerization degree of 30 (compound 2):

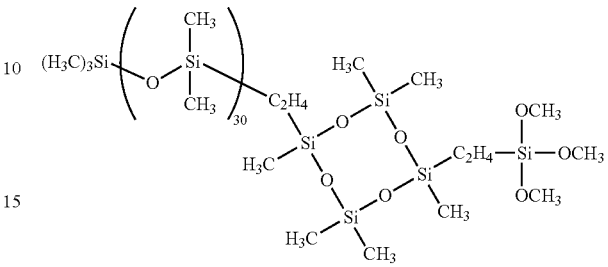

In a 5,000 mL flask, 1,100 g of vinyltrimethoxysilane was added to a solution of 440 g of toluene and 1,992 g of a cyclic siloxane having two Si—H bonds in the presence of a platinum catalyst. The resultant mixture was subjected to reaction at 120° C. for 3 hours. The solvent was removed from the resultant reaction mixture, followed by distillation, to obtain a colorless liquid. 450 g of a linear vinylpolysiloxane (polysiloxane represented by $MD_{30}M^{Vi}$; manufactured by Momentive Performance Materials Inc.) was added to 77 g of the above-obtained liquid. A platinum catalyst was further added and the resultant mixture was subjected to reaction at 120° C. for 5 hours, obtaining an intended siloxane in the form of a colorless oily material.
In the FT IR measurement, an absorption peak appearing around 2,850 cm$^{-1}$ originated from a methoxy group was confirmed. In the $^1$H NMR measurement (at 500 MHz, in CDCl$_3$), a signal appearing at 3.56 ppm originated from a methoxy group was observed. The area ratio of the signal originated from a methoxy group and the signal appearing around 0.04 ppm originated from a methyl group adjacent to silicon has confirmed that one linear polysiloxane structure in which the number of D units is about 30 is introduced per molecule. From the results of the GPC measurement, a monomodal peak (degree of dispersion: 1.15) was confirmed, and the measured average molecular weight was consistent with the structural formula.
<(C) Polyorganosiloxane Having at least Two Alkenyl Groups Bonded to Silicon Atoms per Molecule>
(C1) $M^{Vi}D_nM^{Vi}$ 0.5 Pa·s: α,ω-divinylpolydimethylsiloxane; viscosity 0.5 Pa·s
(C2) $M^{Vi}D_nM^{Vi}$ 0.1 Pa·s: α,ω-divinylpolydimethylsiloxane; viscosity 0.1 Pa·s
(C3) $M^{Vi}D_nM^{Vi}$ 1.0 Pa·s: α,ω-divinylpolydimethylsiloxane; viscosity 1.0 Pa·
<(D1) Polyorganohydrogensiloxane>
$M^HD_{20}M^H$ 0.02 Pa·s: viscosity 0.02 Pa·s
<(D2) Polyorganohydrogensiloxane>
$M^H_mQ$ 0.02 Pa·s: polymethylhydrogen siloxane represented by the average compositional formula $M^H_mQ$ (polymethylhydrogensiloxane consisting of the $M^H$ unit and the Q unit, and having at least three hydrogen atoms bonded to silicon atoms per molecule) (content of the hydrogen atoms bonded to silicon atoms: 1.0 wt. %; number average molecular weight in terms of polystyrene: 800); viscosity 0.02 Pa·s
<Other (D)>
$MD_{20}D^H_{20}M$ <(E) Platinum Catalyst>
Pt-$M^{Vi}M^{Vi}$: 1,2-divinyltetramethyldisiloxane complex of platinum
<(F) Reaction Inhibitor>
Surfynol 61 (manufactured by Nissin Chemical Co., Ltd.)

[Preparation of Thermally Conductive Polysiloxane Composition]

(A), (B), and (C) were kneaded in the blended amounts shown in Tables 1 to 3 (part by mass) by a predetermined method using a planetary mixer to obtain a mixture. Then, (D1), (D2), (E), and (F) were added and kneaded by a predetermined method using a planetary mixer to obtain a composition. Note that, in Comparative Example 1, (D2) was not added. In Comparative Example 2, (D1) was not added. In Comparative Example 3, the other (D) was added in place of (D2).

[Properties]

For the composition and the cured product of the composition, the following properties were measured.

(1) Viscosity

The viscosity of the composition was measured in accordance with JIS K 6249 by using a B-type rotational viscometer (Vismetron VDH) (manufactured by Shibaura System K.K.) and using No. 7 rotor at 10 rpm, at 23° C. for 1 minute.

(2) Hardness

The composition was charged in a mold having the thickness of 6 mm and subjected to heat curing at 70° C. for 30 minutes. The hardness of the cured product of the composition (type E hardness) was measured in accordance with JIS K 6249.

(3) Elongation

The composition was charged in a mold having the thickness of 2 mm and subjected to heat curing at 70° C. for 30 minutes. By using the obtained thermally conductive silicone rubber sheet having the thickness of 2 mm, the elongation of the cured product of the composition B was measured in accordance with JIS K 6249.

(4) Thermal conductivity

The thermal conductivity of the composition was measured by using a thermal conductivity meter (TPS 1500, manufactured by Kyoto Electronics Manufacturing Co., Ltd.). The composition was charged in a metal container that was made from aluminum and coated with Teflon (registered trademark) and that had the inner diameter of 30 mm and the depth of 6 mm, and subject to heat-curing at 70° C. for 30 minutes. The sensor of the thermal conductivity meter was sandwiched by two produced samples to measure the thermal conductivity (unit: W/(m·K)) of the cured product of the composition.

(5) Probe Tack Test

The composition was charged in a metal container that was made from aluminum and coated with Teflon (registered trademark) and that had the size of 60 mm×30 mm and the depth of 6 mm, and heat-cured at 70° C. for 30 minutes. The tackiness of the cured product of the composition B was measured in accordance with JIS Z 0237.

The results are shown in Tables 1 to 3. Each amount of the platinum catalyst in the tables is expressed in terms of a platinum element amount.

TABLE 1

| | | | Example | | | | | | | |
|---|---|---|---|---|---|---|---|---|---|---|
| | | | 1 | 2 | 3 | 4 | 5 | 6 | 7 | 8 |
| (A) | | AS-40 | 25 | 25 | 25 | 25 | 25 | 25 | 25 | 25 |
| | | AL43KT | 50 | 50 | 50 | 50 | 50 | 50 | 50 | 50 |
| | | AL160SG-4 | 25 | 25 | 25 | 25 | 25 | 25 | 25 | 25 |
| | | Silazane-treated silica | 0.4 | 0.4 | 0.4 | 0.4 | 0.4 | 0.4 | 0.4 | 0.4 |
| (B) | (B1) | Compound 1 | 1.5 | 1.5 | 1.5 | 1.5 | 1.5 | 1.5 | 1.5 | 1.5 |
| | (B2) | Compound 2 | | | | | | | | |
| (C) | (C1) | $M^{Vi}D_nM^{Vi}$ 0.5 Pa·s | 10.6 | 10.6 | 10.6 | 10.6 | 10.6 | 10.6 | 10.6 | 10.6 |
| | (C2) | $M^{Vi}D_nM^{Vi}$ 0.1 Pa·s | | | | | | | | |
| | (C3) | $M^{Vi}D_nM^{Vi}$ 1.0 Pa·s | | | | | | | | |
| (D1) | | $M^H D_n M^{Vi}$ 0.02 Pa·s | 0.96 | 0.80 | 0.85 | 1.00 | 1.10 | 0.70 | 0.74 | 0.53 |
| (D2) | | $M^H_m Q$ 0.02 Pa·s | 0.015 | 0.028 | 0.030 | 0.035 | 0.039 | 0.042 | 0.045 | 0.075 |
| Other (D) | | $MD_{20}D^H_{20}M$ | | | | | | | | |
| (E) | | Pt-$M^{Vi}M^{Vi}$ | 2 ppm | 2 ppm | 2 ppm | 2 ppm | 2 ppm | 2 ppm | 2 ppm | 2 ppm |
| (F) | | Surfynol 61 | 0.02 | 0.02 | 0.02 | 0.02 | 0.02 | 0.02 | 0.02 | 0.02 |
| $(H_{D1} + H_{D2})/Vi_c$ | | | 0.85 | 0.80 | 0.85 | 1.00 | 1.10 | 0.80 | 0.85 | 0.85 |
| $H_{D1}:H_{D2}$ | | | 9:1 | 8:2 | 8:2 | 8:2 | 8:2 | 7:3 | 7:3 | 5:5 |
| Viscosity (No. 7 × 10 rpm, type B) | | | 122 | 124 | 120 | 121 | 119 | 129 | 127 | 130 |
| Hardness (cured at 70° C. for 30 minutes) type E | | | 15 | 25 | 45 | 67 | 72 | 51 | 63 | 68 |
| Elongation (%) | | | 130 | 120 | 60 | 50 | 40 | 60 | 40 | 40 |
| Thermal conductivity (W/mK) | | | 2.40 | | 2.39 | | 2.35 | | | 2.42 |
| Probe tack test (N) | | | 1.4 | 1.3 | 1.6 | 0.7 | 0.7 | 1.0 | 0.8 | 0.9 |

TABLE 2

| | | | Example | | | | | | |
|---|---|---|---|---|---|---|---|---|---|
| | | | 9 | 10 | 11 | 12 | 13 | 14 | 15 |
| (A) | | AS-40 | 25 | 25 | 25 | 25 | 25 | 25 | 25 |
| | | AL43KT | 50 | 50 | 50 | 50 | 50 | 50 | 50 |
| | | AL160SG-4 | 25 | 25 | 25 | 25 | 25 | 25 | 25 |
| | | Silazane-treated silica | 0.4 | 0.4 | 0.4 | 0.4 | 0.4 | 0.4 | 0.4 |
| (B) | (B1) | Compound 1 | 1.5 | 1.5 | 1.5 | 1.5 | 1.5 | 1.5 | 1.5 |
| | (B2) | Compound 2 | | | | | | | |

TABLE 2-continued

| | | | Example 9 | Example 10 | Example 11 | Example 12 | Example 13 | Example 14 | Example 15 |
|---|---|---|---|---|---|---|---|---|---|
| (C) | (C1) | $M^{Vi}D_nM^{Vi}$ 0.5 Pa·s | 10.6 | | | | | | |
| | (C2) | $M^{Vi}D_nM^{Vi}$ 0.1 Pa·s | | 10.6 | 10.6 | 10.6 | | | |
| | (C3) | $M^{Vi}D_nM^{Vi}$ 1.0 Pa·s | | | | | 10.6 | 10.6 | 10.6 |
| (D1) | | $M^HD_nM^{Vi}$ 0.02 Pa·s | 0.80 | 1.63 | 1.75 | 1.86 | 0.83 | 0.87 | 0.92 |
| (D2) | | $M^H_mQ$ 0.02 Pa·s | 0.028 | 0.46 | 0.49 | 0.52 | 0.024 | 0.025 | 0.026 |
| Other (D) | | $MD_{20}D^H_{20}M$ | | | | | | | |
| (E) | | Pt-$M^{Vi}M^{Vi}$ | 2 ppm | 2 ppm | 2 ppm | 2 ppm | 2 ppm | 2 ppm | 2 ppm |
| (F) | | Surfynol 61 | 0.02 | 0.02 | 0.02 | 0.02 | 0.02 | 0.02 | 0.02 |
| $(H_{D1} + H_{D2})/Vi_c$ | | | 0.80 | 0.70 | 0.75 | 0.80 | 0.85 | 0.90 | 0.95 |
| $H_{D1}:H_{D2}$ | | | 8:2 | 8:2 | 8:2 | 8:2 | 8:2 | 8:2 | 8:2 |
| Viscosity (No. 7 × 10 rpm, type B) | | | 75 | 20 | 19 | 18 | 130 | 123 | 115 |
| Hardness (cured at 70° C. for 30 minutes) type E | | | 33 | 24 | 36 | 45 | 27 | 35 | 51 |
| Elongation (%) | | | 120 | 130 | 100 | 50 | 200 | 140 | 90 |
| Thermal conductivity (W/mK) | | | 2.43 | 2.31 | 2.30 | 2.30 | 2.45 | 2.44 | 2.41 |
| Probe tack test (N) | | | 1.5 | 1.2 | 1.0 | 0.7 | 1.8 | 1.6 | 1.5 |

TABLE 3

| | | | Comparative Example 1 | Comparative Example 2 | Comparative Example 3 |
|---|---|---|---|---|---|
| (A) | | AS-40 | 25 | 25 | 25 |
| | | AL43KT | 50 | 50 | 50 |
| | | AL160SG-4 | 25 | 25 | 25 |
| | | Silazane-treated silica | 0.4 | 0.4 | 0.4 |
| (B) | (B1) | Compound 1 | 1.5 | 1.5 | 1.5 |
| (C) | (C1) | $M^{Vi}D_nM^{Vi}$ 0.5 Pa·s | 10.6 | 10.6 | 10.6 |
| (D1) | | $M^HD_nM^H$ 0.02 Pa·s | 1.06 | | 0.9 |
| (D2) | | $M^H_mQ$ 0.02 Pa·s | | 0.150 | |
| Other (D) | | $MD_{20}D^H_{20}M$ | | | 0.13 |
| (E) | | Pt-$M^{Vi}M^{Vi}$ | 2 ppm | 2 ppm | 2 ppm |
| (F) | | Surfynol 61 | 0.02 | 0.02 | 0.02 |
| $(H_{D1} + H_{D2})/Vi_c$ | | | 0.85 | 0.85 | |
| $H_{D1}:H_{D2}$ | | | 10:0 | 0:10 | |
| Viscosity (No. 7 × 10 rpm, type B) | | | 121 | 140 | 135 |
| Hardness (cured at 70° C. for 30 minutes) type E | | | Not cured | 75 | 50 |
| Elongation (%) | | | | <5 | 30 |
| Thermal conductivity (W/mK) | | | | 2.45 | 2.31 |
| Probe tack test (N) | | | | 0.3 | 0.5 |

All of the cured products of the compositions of Examples exhibited excellent flexibility due to their high elongation and exhibited excellent tackiness.

From the comparison of Examples 1, 3, 7, and 8 and the comparison of Examples 6 and 2, when the value $H_{D1}$ relative to the sum of $H_{D1}$ and $H_{D2}$ was greater, higher elongation and superior tackiness were achieved.

From the comparison of Examples 2 to 5, the comparison of Examples 6 and 7, the comparison of Examples 10 to 12, and the comparison of Examples 13 to 15, when the ratio $(H_{D1}+H_{D2})/Vi_C$ was smaller, higher elongation was achieved.

From the comparison of Examples 2 to 5, each of Examples 2 and 3 in which the ratio $(H_{D1}+H_{D2})/Vi_C$ was 0.85 or less exhibited particularly excellent tackiness.

From the comparison of Examples 9 and 11, when the viscosity of (C) was increased, higher elongation and superior tackiness were achieved.

On the other hand, because Comparative Example 1 was a composition containing no (D2), the composition of Comparative Example 1 was not cured. Because Comparative Example 2 was a composition containing no (D1), the elongation of the cured product of the composition of Comparative Example 2 was remarkably insufficient, and the tackiness was poor. Because Comparative Example 3 used, in place of (D2), a crosslinking agent having silicon-bonded hydrogen atoms in the middle units; however, the elongation of the cured product of the composition of Comparative Example 3 was remarkably insufficient, and the tackiness was poor.

The invention claimed is:

1. A thermally conductive polysiloxane composition comprising:
    (A) a thermally conductive filler;
    (B) a siloxane compound having an alkoxysilyl group and a linear siloxane structure;
    (C) a polyorganosiloxane having at least two alkenyl groups bonded to silicon atoms per molecule;
    (D1) a linear polyorganohydrogensiloxane represented by the following general formula (4):

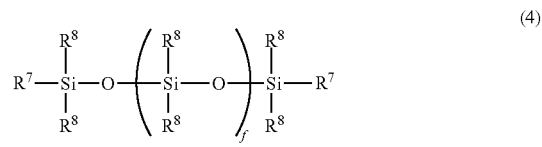

(4)

wherein:
    $R^7$ is a hydrogen atom,
    $R^8$ is each independently a monovalent hydrocarbon group having no aliphatic unsaturated bond and having 1 to 12 carbon atoms, and
    f is 1 to 200;
(D2) a polyorganohydrogensiloxane having per molecule at least three units represented by the following general formula (5):

(5)

wherein:
    $R^9$ is each independently a monovalent hydrocarbon group having no aliphatic unsaturated bond and having 1 to 12 carbon atoms,
    $R^{10}$ is a hydrogen atom,
    g is an integer of 0 to 2,
    h is an integer of 1 or 2, and
    g+h is an integer of 1 to 3, with the proviso that a case in which g is 1 and h is 1 is excluded; and
(E) a platinum catalyst,
wherein (D2) is a polyorganohydrogensiloxane comprising a $R^{11}_2HSiO_{1/2}$ unit, wherein $R^{11}$ is synonymous with $R^9$, and a $SiO_{4/2}$ unit, and having at least three hydrogen atoms bonded to silicon atoms per molecule, wherein a ratio $((H_{D1}+H_{D2})/Vi_C)$ of a sum $(H_{D1}+H_{D2})$ of a number $H_{D1}$ of hydrogen atoms bonded to silicon atoms of (D1) and a number $H_{D2}$ of hydrogen atoms bonded to silicon atoms of (D2) to a number $Vi_C$ of the alkenyl groups of (C) is 0.85 or less, and wherein a ratio of $H_{D1}:H_{D2}$ is in a range of from 9:1 to 8:2.

2. The thermally conductive polysiloxane composition according to claim 1, wherein (B) is a siloxane compound represented by the following general formula (1):

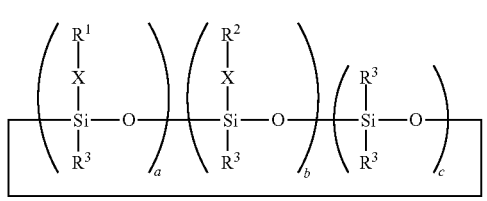

wherein:

$R^1$ is a group having an alkoxysilyl group having 1 to 4 carbon atoms, $R^2$ is a linear organosiloxy group represented by the following general formula (2):

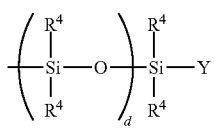

wherein:

$R^4$ is each independently a monovalent hydrocarbon group having 1 to 12 carbon atoms, Y is a group selected from the group consisting of a methyl group, a vinyl group, and $R^1$, and d is an integer of 2 to 500;

X is each independently a divalent hydrocarbon group having 2 to 10 carbon atoms, a and b are each independently an integer of 1 or more, c is an integer of 0 or more, a+b+c is an integer of 4 or more, and $R^3$ is each independently a monovalent hydrocarbon group having 1 to 6 carbon atoms or a hydrogen atom.

3. The thermally conductive polysiloxane composition according to claim 1, wherein (C) is a linear polyorganosiloxane represented by the following general formula (3):

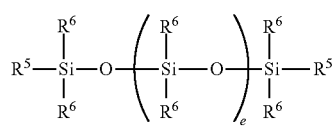

wherein:

$R^5$ is each independently an alkenyl group having 2 to 6 carbon atoms, $R^6$ is each independently a monovalent hydrocarbon group having 1 to 12 carbon atoms, and e is a number such that the viscosity of 0.01 to 50 Pa·s at 23° C.

* * * * *